United States Patent
Ise

(10) Patent No.: US 7,298,642 B2
(45) Date of Patent: Nov. 20, 2007

(54) MAGNETIC RESISTANCE MEMORY AND METHOD OF WRITING DATA

(75) Inventor: Masahiro Ise, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/012,114

(22) Filed: Dec. 16, 2004

(65) Prior Publication Data

US 2006/0044867 A1    Mar. 2, 2006

(30) Foreign Application Priority Data

Aug. 27, 2004   (JP)   ............... 2004-249051

(51) Int. Cl.
*G11C 11/00*   (2006.01)
(52) U.S. Cl. ................. 365/158; 365/148; 365/189.07
(58) Field of Classification Search ................ 365/148, 365/189.07, 158
See application file for complete search history.

(56) References Cited

U.S. PATENT DOCUMENTS 3,530,441 A    9/1970   Ovshinsky 6,438,665 B2 *  8/2002   Norman ................. 711/159
2005/0235118 A1 * 10/2005   Moriyama et al. ......... 711/154

FOREIGN PATENT DOCUMENTS

| JP | 7-65586 A | 3/1995 |
|---|---|---|
| JP | 2003-330790 A | 11/2003 |
| WO | 03/079365 | 9/2003 |

OTHER PUBLICATIONS

K.F. Strauss and T. Daud, "Overview of Radiation Tolerant Unlimited Write Cycle Non-Volatile Memory," *Proc. 2000 IEEE Aerospace Conf.*, vol. 5, pp. 399-408.
S. Lai and T. Lowrey, "OUM—A 180 nm Nonvolatile Memory Cell Element Technology for Stand Alone and Embedded Applications," *IEDM Dig.* (2001), pp. 803-806.

* cited by examiner

*Primary Examiner*—Hoai V. Ho
(74) *Attorney, Agent, or Firm*—Staas & Halsey LLP

(57) ABSTRACT

A magnetic resistance memory includes an identity determining unit that compares, bit by bit, first data stored in an address specified by a write request with second data to be written to the address, and that determines whether bit-by-bit values of the first data and the second data are identical; and a writing control unit that halts, when a bit of the second data is identical with a corresponding bit of the first data, writing of the bit of the second data.

12 Claims, 6 Drawing Sheets

150

MAGNETIC RESISTANCE MEMORY AND METHOD OF WRITING DATA

BACKGROUND OF THE INVENTION

1) Field of the Invention

The present invention relates to a magnetic resistance memory and a writing method of the magnetic resistance memory.

2) Description of the Related Art

Magnetic resistance memory (MRAM: Magnetic Random Access Memory) is gaining ground in recent years as a next generation memory for its high speed and non-volatile properties. FIG. 5 is a schematic diagram of a basic principle of an MRAM. Each memory cell is formed of a non-magnetic layer 502 sandwiched between a first ferromagnetic layer 501 and a second ferromagnetic layer 503.

The first ferromagnetic layer 501 is a changeable ferromagnetic layer, of which the magnetization direction can be changed by passing an electric current, whereas the second ferromagnetic layer 503 is an unchangeable ferromagnetic layer, of which the magnetization direction remains constant. When the first ferromagnetic layer 501 and the second ferromagnetic layer 503 have a same magnetization direction, magnetic resistance between the first ferromagnetic layer 501 and the second ferromagnetic layer 503 decreases. When the first ferromagnetic layer 501 and the second ferromagnetic layer 503 have different magnetization directions, the magnetic resistance between the first ferromagnetic layer 501 and the second ferromagnetic layer 503 increases.

The MRAM memory cell stores information based on a degree of magnetic resistance, which is dependent on the magnetization direction of the first ferromagnetic layer 501, between the first ferromagnetic layer 501 and the second ferromagnetic layer 503. For instance, when the magnetic resistance is low, a one-bit data '0' is stored, and when the magnetic resistance is high, a one-bit data '1' is stored.

Data can be written to MRAM by passing an electric current in a destination memory cell to change the magnetization direction of the changeable ferromagnetic layer to a predetermined direction. A technology relating to the MRAM is disclosed in, for example, "MRAM", URL: http://www.nanoelectronic.jp/kaitai/mram/, searched on Jul. 29, 2004.

However, writing data to MRAM requires a constant application of electric current to the destination memory cell, resulting in large power consumption.

SUMMARY OF THE INVENTION

It is an object of the present invention to solve at least the above problems in the conventional technology.

A magnetic resistance memory according to one aspect of the present invention includes an identity determining unit that compares, bit by bit, first data stored in an address specified by a write request with second data to be written to the address, and that determines whether bit-by-bit values of the first data and the second data are identical; and a writing control unit that halts, when a bit of the second data is identical with a corresponding bit of the first data, writing of the bit of the second data.

A method of writing data with a magnetic resistance memory according to another aspect of the present invention includes comparing, bit by bit, first data stored in an address specified by a write request with second data to be written to the address; determining whether bit-by-bit values of the first data and the second data are identical; and halting, when a bit of the second data is identical with a corresponding bit of the first data, writing of the bit of the second data.

The other objects, features, and advantages of the present invention are specifically set forth in or will become apparent from the following detailed description of the invention when read in conjunction with the accompanying drawings.

DETAILED DESCRIPTION

Exemplary embodiments of a magnetic resistance memory and a writing method of the magnetic resistance memory according to the present invention will be explained with reference to the accompanying drawings.

Figure 1:
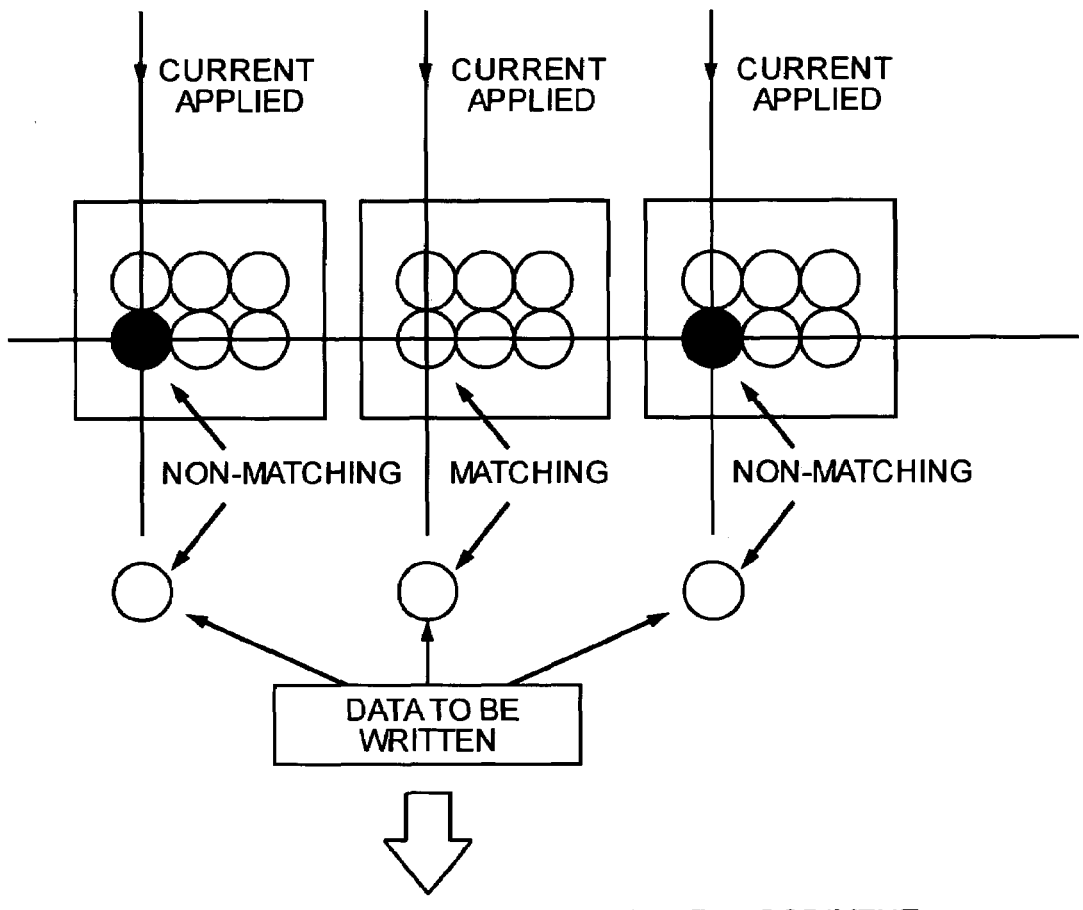
FIG. 1 is a schematic diagram of an MRAM according to an embodiment of the present invention.
Figure 1:
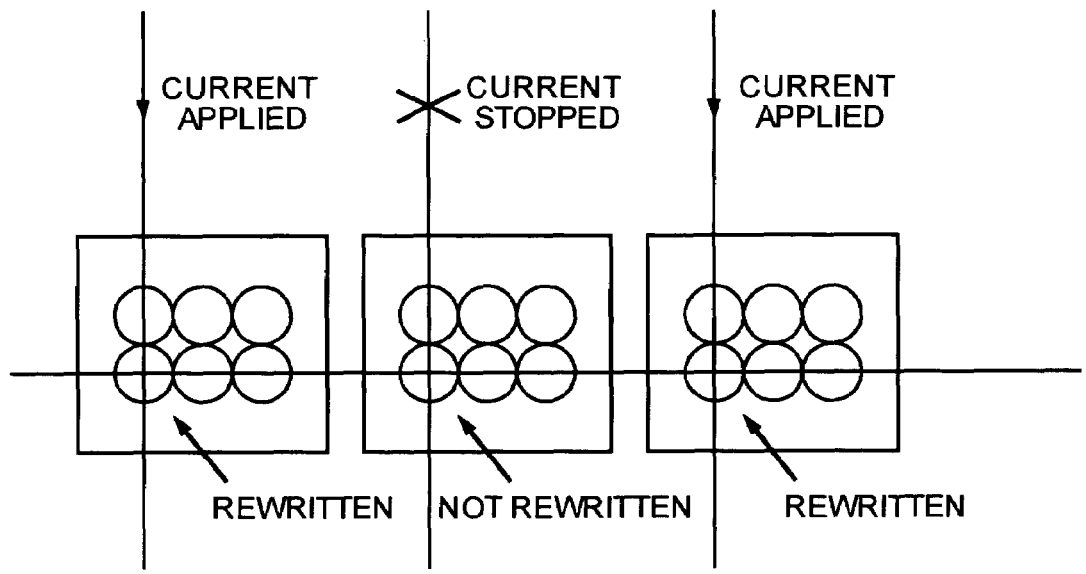

FIG. 1 is a schematic diagram of an MRAM according to an embodiment of the present invention. When data is being written to the MRAM, data to be written and existing data are compared and no electric current is applied to the memory cell having same data as the data to be written. Consequently, an electric current for writing is not constantly applied to all destination cells as in a conventional MRAM.

For instance, as shown in FIG. 1, if the black circles are taken as representing '1' and the white circles as '0', the 3-bit data stored in the MRAM is '101' and the data to be written is '000'. Therefore, in the conventional MRAM, the electric current for writing has to be applied to all the three memory cells to write the data to the MRAM. However, in the MRAM according to the present embodiment, the electric current for writing is not applied to the memory cell of the second bit since the existing data in that memory cell is the same as the data to be written.

Thus, when writing data to the MRAM according to the present embodiment, the data existing in the memory cell and the data to be written are compared, and if found to be the same, the application of electric current for writing to the relevant memory cell is stopped. As a result, power consumption during writing to the MRAM can be curtailed.

Figure 2:
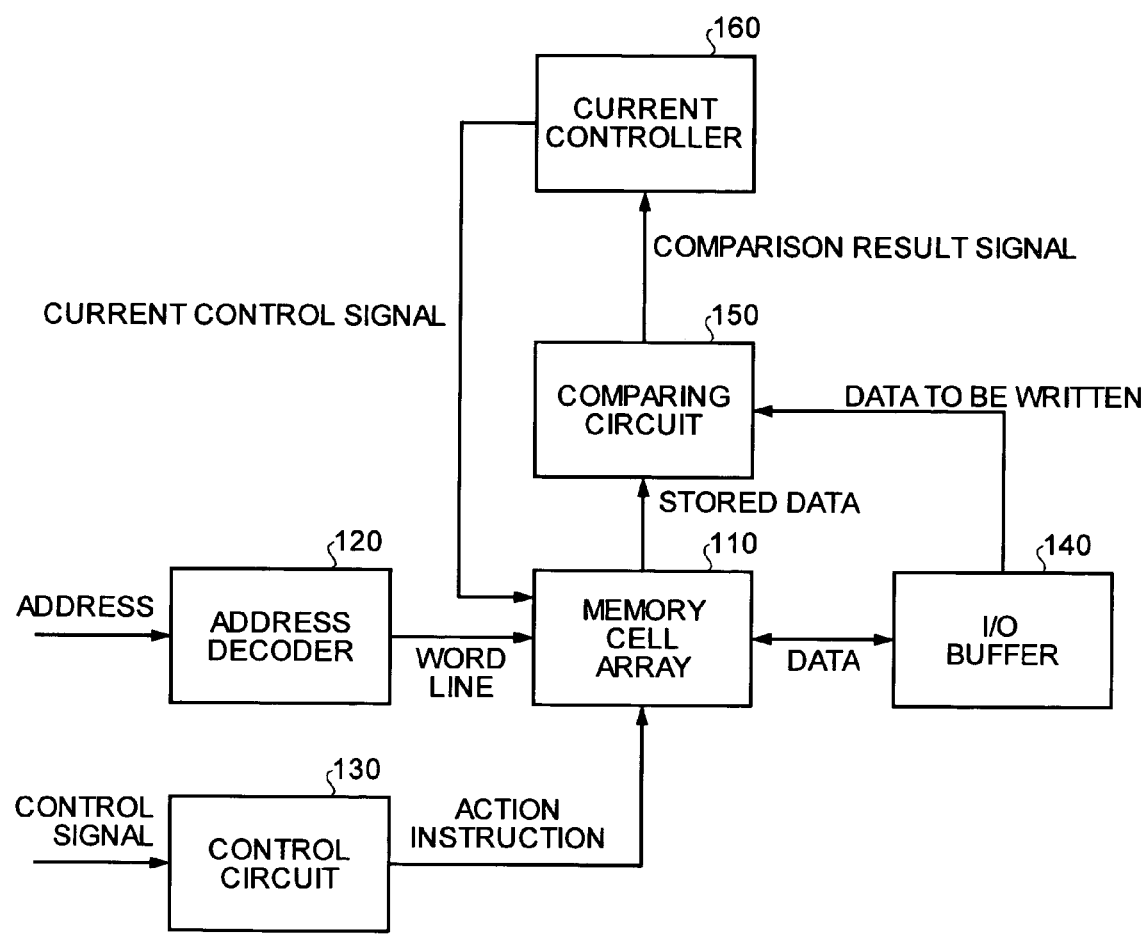
FIG. 2 is a block diagram of the MRAM.

FIG. 2 is a block diagram of the MRAM according to the present embodiment. The MRAM includes a memory cell array 110, an address decoder 120, a control circuit 130, an I/O buffer 140, a comparing circuit 150, and a current controller 160.

The memory cell array 110 includes a 3-dimensional array of MRAM cells, which are the memory cells of the MRAM, and a control unit that controls reading data from and writing data to each MRAM cell. The capacity of the memory cell array 110 is 256 K word, each word being 16-bit.

Figure 3:
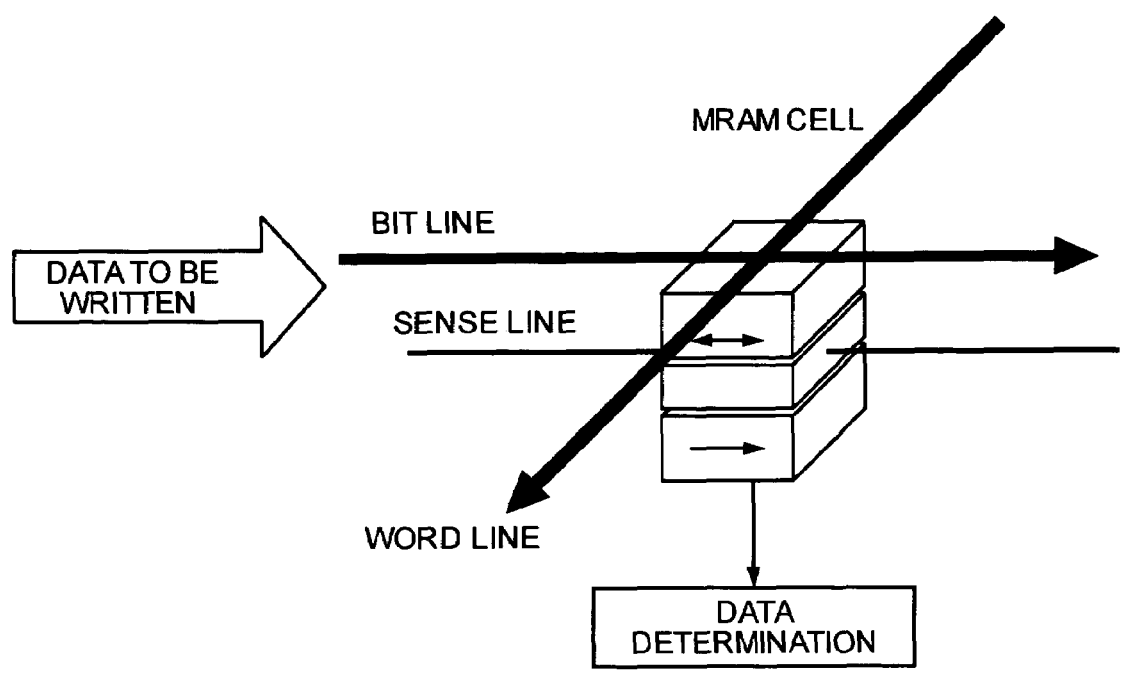
FIG. 3 is a schematic diagram of an MRAM cell.

FIG. 3 is a schematic diagram of an MRAM cell. A bit line is used for writing data and a sense line is used for reading data. A word line is composed of 16 MRAM cells. Data equivalent to one word is read from and written to 16 MRAM cells of the word line.

The address decoder 120 receives an address signal and specifies the word line corresponding to the received address. The memory cell array 110 reads data from or writes data to 16 MRAM cells of the word line specified by address decoder 120.

The control circuit 130 receives a control signal such as an instruction to writing data to or read data from the memory cell array 110, etc. and carries out the instruction according to the control signal.

The I/O buffer 140 is a 10-bit buffer that stores the data read from or written to the memory cell array 110.

When writing data to the memory cell array 110, the comparing circuit 150 compares, bit by bit, the data existing in the word line where the data is to be written and the data to be written stored in the I/O buffer 140, and creates a comparison result signal that indicates whether the compared bits are the same.

Figure 6:
FIG. 6 illustrates an embodiment of a comparing circuit 150 included in the MRAM structure of FIG. 2.

For instance, the comparing circuit 150 creates the comparison result signal by carrying out exclusive OR logical operation (see FIG. 6) of the data existing in the word line where the data is to be written and the data to be written stored in the I/O buffer 140.

The current controller 160 outputs to the memory cell array 110 a current control signal that controls the electric current for writing applied to the MRAM cell based on the comparison result signal created by the comparing circuit 150.

In other words, the current controller 160 creates a current control signal that controls the electric current for writing in such a way that the application of electric current for writing is stopped for the bits whose values match, from among the bits of the data existing in the word line where the data is to be written and the data to be written stored in the I/O buffer 140.

Thus, when writing data to the memory cell array 110, the comparing circuit 150 compares, bit by bit, the data existing in the word line where the data is to be written and the data to be written stored in the I/O buffer 140, and creates a comparison result signal indicating whether the bits are the same. The current controller 160 creates, based on the comparison result signal, the current control signal that controls the electric current for writing, and stops the application of electric current for writing to the MRAM cells that have the same value.

In the present embodiment, the current controller 160 creates a single current control signal, which is a 16-bit data that indicates for each MRAM cell whether the application of electric current for writing is to be stopped. However, the 16-bit data may also be broken down into a plurality of current control signals which may be serially output to the memory cell array 110.

Upon receiving from the control circuit 130 an instruction to write data to the word line specified by the address decoder 120, the memory cell array 110 stops the electric current for writing based on the current control signal received from the current controller 160.

In other words, when writing the data stored in the I/O buffer 140, the memory cell array 110 stops the electric current for writing to the MRAM cell that has the same bit value as the bit value of the data to be written.

Figure 4:
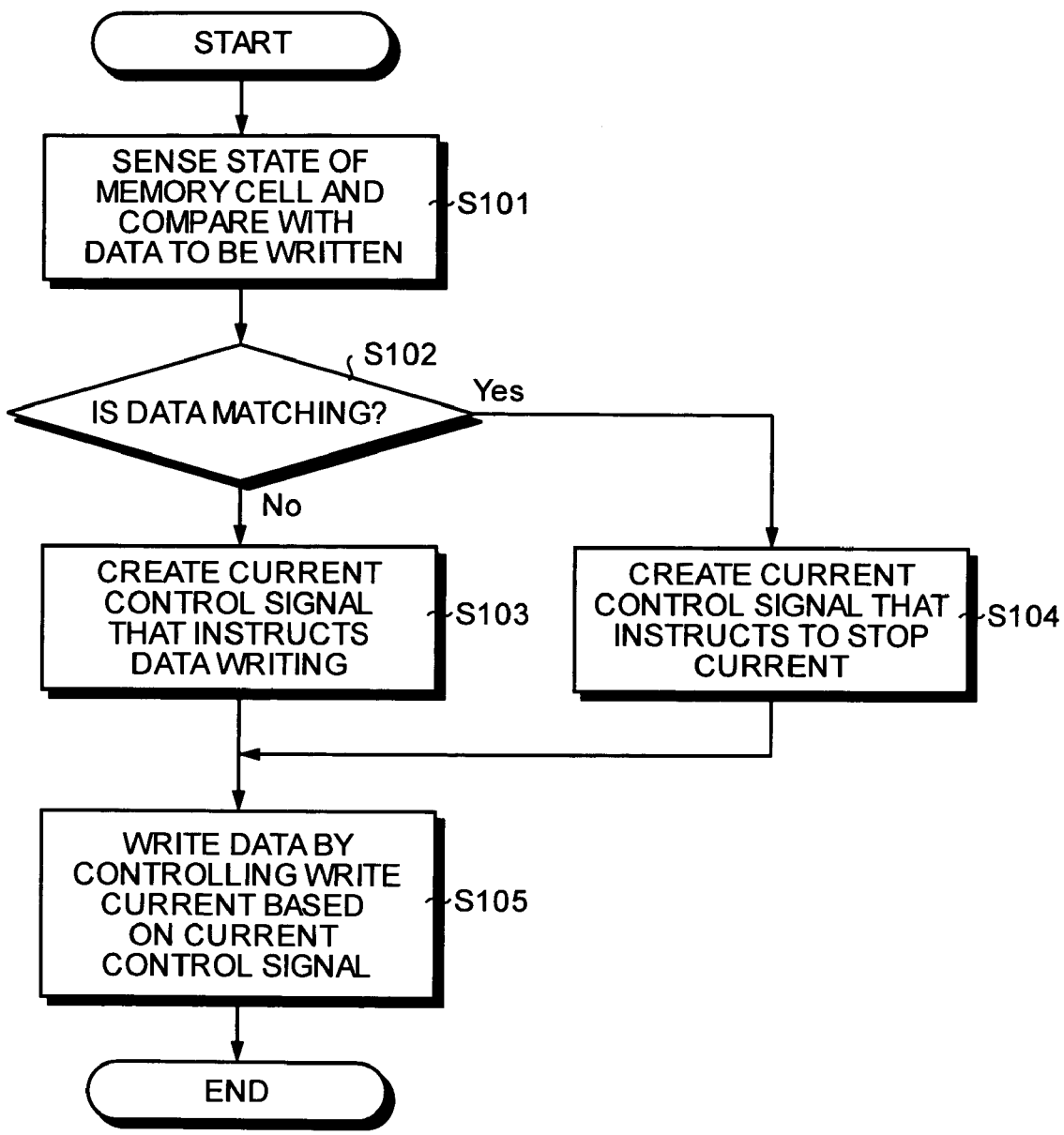
FIG. 4 is a flowchart of a writing process of the MRAM.
Figure 5:
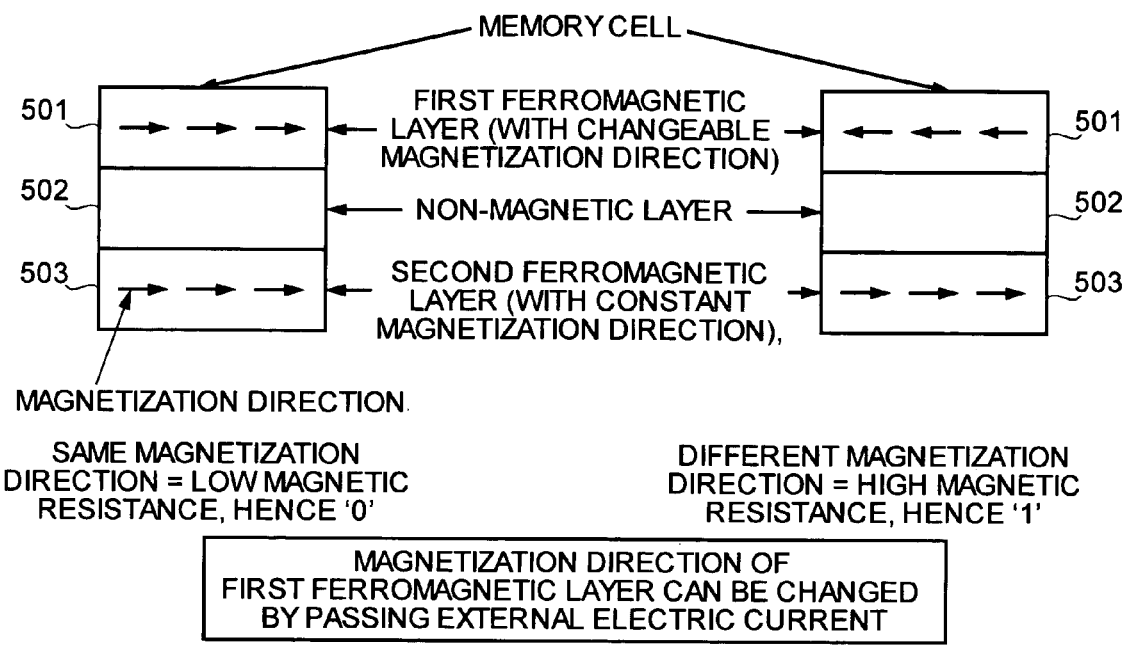
FIG. 5 is a schematic diagram of a basic principle of the MRAM.

FIG. 4 is a flow chart of a writing process of the MRAM according to the present embodiment. The comparing circuit 150 of the MRAM detects a state of the memory cell where data is to be written, and compares, bit by bit, the state with the data to be written in the I/O buffer 140 (step S101).

Based on the comparison result from the comparing circuit 150, for the bits that do not match ("NO" at step S102), the current controller 160 creates the current control signal that instructs data writing (step S103) and for the bits that match ("YES" at step S102), the current controller 160 creates the current control signal that instructs stoppage of electric current for writing (step S104).

The memory cell array 110 controls the electric current for writing based on the current control signal created by the current controller 160, and writes the data stored in the I/O buffer 140 (step S105).

Thus, the comparing circuit 150 detects the state of the memory cell to which data is to be written, and compares, bit by bit, with the data to be written stored in the I/O buffer 140. The current controller 160 creates the current control signal that instructs to stop electric current for writing for the bits that match. Thus, the application of the electric current for writing to the MRAM cells that have the same value before and after data writing is stopped.

To sum up, in the present embodiment, when writing data to the memory array 110, the comparing circuit 150 compares, bit by bit, the data existing in the word line where the data is to be written and the data to be written stored in the I/O buffer 140, and creates the comparison result signal. The current controller 160 creates, based on the comparison result signal, the current control signal that controls the electric current for writing. The memory cell array 110 controls the electric current for writing based on the current control signal. Consequently, the application of electric current for writing to the MRAM cells is stopped in the cases where the existing data and the data to be written are the same, and as a result, power consumption can be reduced.

In the present embodiment, the word length of the memory array is taken as 16 bits and the capacity of the memory array is 256 K word. The present invention is equally applicable for memory arrays having any word length or capacity.

According to the present invention, power consumption is reduced.

Furthermore, according to the present invention, overall power consumption is reduced.

Moreover, according to the present invention, power consumption during writing is reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A magnetic resistance memory comprising:
   an identity determining unit that compares, bit by bit, first data stored in an address specified by a write request with second data to be written to the address, that determines whether bit-by-bit values of the first data and the second data are identical, and that creates a comparison result signal indicating whether the compared bits are the same or not, wherein the first data and the second data include a plurality of bits; and
   a first current control unit that creates a current control signal based on the comparison result signal, wherein the current control signal instructs to halt writing of any bit of the second data when the bit of the second data is identical with a corresponding bit of the first data; and
   a memory cell array that halts writing of the bit of the second data upon receiving the current control signal instructing to halt writing of the bit of the second data.

2. The magnetic resistance memory according to claim 1, wherein the memory cell array halts the writing of the bit of the second data by cutting off an electric current flowing into a corresponding memory cell.

3. The magnetic resistance memory according to claim 1, wherein the current control signal corresponds to a bit width equal to a bit width of the second data.

4. The magnetic resistance memory according to claim 1, wherein the identity determining unit determines whether the bit-by-bit values of the first data and the second data are identical by an exclusive OR operation.

5. A method of writing data into a magnetic resistance memory, the method comprising:
   comparing, bit by bit, first data stored in an address specified by a write request with second data to be written to the address, wherein the first data and the second data include a plurality of bits;
   determining whether bit-by-bit values of the first data and the second data are identical;
   creating a comparison result signal indicating whether the compared bits are the same or not;
   creating a current control signal based on the comparison result signal, wherein the current control signal instructs to halt writing of the bit of the second data, when the bit of the second data is identical with the corresponding bit of the first data; and
   halting writing of the bit of the second data upon receiving the current control signal instructing to halt writing of the bit of the second data.

6. The method according to claim 5, wherein the halting includes halting the writing of the bit of the second data by cutting off an electric current flowing into a corresponding memory cell.

7. The method according to claim 5, wherein the current control signal corresponds to a bit width equal to a bit width of the second data.

8. The method according to claim 5, wherein the determining includes determining whether the bit-by-bit values of the first data and the second data are identical by an exclusive OR operation.

9. A magnetic random access memory (MRAM) system, comprising:
   a memory cell array to store data;
   an I/O interface to receive new data to be stored in the memory cell array and to transmit the data stored in the memory cell array upon request; and
   a control unit to compare bit-by-bit the new data to be stored in the memory cell array at an address with existing data at the address and to generate a current control signal corresponding to the bit-by-bit comparison that enables writing bits of the new data in memory cells of the memory cell array when corresponding bits of the existing data and the bits of the new data to be written in a memory cell are not identical.

10. The magnetic resistance memory according to claim 1, wherein the current control signal corresponds to 16-bit data.

11. The magnetic resistance memory according to claim 1, further comprising an I/O buffer, wherein
   the I/O buffer stores the first data or the second data and sends the second data to the identity determining unit, and
   the identity determining unit receives the second data from the I/O buffer, compares, bit by bit, first data stored in an address specified by a write request with second data to be written to the address, determines whether bit-by-bit values of the first data and the second data are identical, and creates a comparison result signal indicating whether the compared bits are the same or not.

12. The magnetic resistance memory according to claim 1, wherein the memory cell array includes a control unit which halts writing of a bit of the second data upon receiving the current signal instructing to halt writing of the bit of the second data.

* * * * *